United States Patent [19]

Yatsurugi et al.

[11] 4,147,814
[45] Apr. 3, 1979

[54] METHOD OF MANUFACTURING HIGH-PURITY SILICON RODS HAVING A UNIFORM SECTIONAL SHAPE

[75] Inventors: Yoshifumi Yatsurugi, Fujisawa; Atsushi Yusa, Ninomiyamachi; Nagao Takahashi, Hiratsuka, all of Japan

[73] Assignee: Kabushiki Kaisha Komatsu Seisakusho, Tokyo, Japan

[21] Appl. No.: 882,819

[22] Filed: Mar. 2, 1978

[30] Foreign Application Priority Data

Mar. 3, 1977 [JP] Japan ................................. 52/22212

[51] Int. Cl.² .............................................. B05D 5/12
[52] U.S. Cl. ........................................ 472/51; 264/81; 156/611; 427/86; 423/349; 423/350; 118/49.5
[58] Field of Search ................ 427/51, 86, 87; 264/81; 118/48, 49.1, 49, 49.5; 156/611, 613; 423/349, 350

[56] References Cited

U.S. PATENT DOCUMENTS 3,011,877  12/1961  Schweickert ......................... 422/129
3,053,638  9/1962  Reiser ...................................... 427/51
3,099,534  7/1963  Schweickert ......................... 423/346
3,147,141  9/1964  Ishizuka ............................... 118/49.1
3,941,906  3/1976  Stut ................................. 118/49.5 X Primary Examiner—Sam Silverberg
Attorney, Agent, or Firm—Armstrong, Nikaido, Marmelstein & Kubovcik

[57] ABSTRACT

A method of manufacturing high-purity silicon rods having a uniform sectional shape by thermally decomposing monosilane on a plurality of rod-shaped silicon carrier members which have been red-heated by directly passing an electric current therethrough, said silicon carrier members being thermally insulated from one another, characterized in that monosilane is supplied into a pyrolysis container through multi-stage monosilane supply ports located in parallel with the axes of said silicon carrier members held vertically within the pyrolysis container, and that the amount of supply of monosilane through the upper supply ports is increased as compared with that through the lower supply ports in response to the increase of the diameter of each of said silicon rods.

4 Claims, 3 Drawing Figures

METHOD OF MANUFACTURING HIGH-PURITY SILICON RODS HAVING A UNIFORM SECTIONAL SHAPE

BACKGROUND OF THE INVENTION

1. Field of the Invention:

This invention relates to a method of manufacturing high-purity silicon rods, for use in a float zone melting process, by pyrolyzing monosilane on rod-shaped and red-heated silicon carrier members located within a pyrolysis container thereby depositing high-purity silicon thereon, and more particularly to a method of producing high-purity silicon rods having a uniform sectional shape.

2. Description of the Prior Art:

Semi-conductive silicon rods have heretofore been manufactured by pyrolyzing or reducing by hydrogen a gaseous silicon compound, such as monosilane, silicon tetrachloride, trichloro-silane, etc., which has been refined on rod-shaped and red-heated silicon carrier members or a high-melting point metal having good electric conductivity such as, for example, tantalum wire, thereby depositing high-purity silicon on the carrier members. Such methods of manufacturing high-purity silicon rods include the process of blowing off a raw material gas from the lower side disclosed in U.S. Pats. Nos. 3,011,877 and 3,099,534, and the process of blowing off a raw material gas from the upper side disclosed in U.S. Pat No. 3,147,141. In the case of depositing silicon on rod-shaped and red-heated silicon carrier members in the process of blowing off a raw material gas from the lower side, the diameter of the lower part of each silicon rod to be grown up tends to become greater than that of the upper part thereof, and such tendency will become more conspicuous with the increase of the diameter of each silicon rod to be grown up. Further, in the case of depositing silicon on the rod-shaped and red-heated silicon carrier members in the process of blowing off a raw material gas from the upper side, the diameter of the upper part of each silicon rod tends to become greater than that of the lower part thereof, and such tendency will become more conspicuous with the increase of the diameter of each silicon rod to be grown up.

Whilst, the silicon rods used for manufacturing single-crystal silicon by a float zone melting process are usually molded to have a uniform diameter or an approximately perfect roundness by scraping off uneven parts of the silicon rods with a view of preventing occurrence of possible accidents resulting from the irregular shape thereof during the float zone melting process. As mentioned above, silicon rods obtained by the rod-shaped multi-crystal silicon manufacturing process will have imperfect roundness or uneven diameter in the longitudinal direction thereof, and therefore tend to reduce the yield thereof with the increase of the diameter of the raw material for single-crystal silicon.

A part of the above-mentioned disadvantages can be overcome by the method which has already been proposed by the applicant of the present invention; that is, the method of manufacturing silicon rods having approximately perfect roundness by pyrolyzing monosilane on a plurality of rod-shaped silicon carrier members which have been red-heated by directly passing an electric current therethrough thereby depositing high-purity silicon thereon while insulating the radiant heat between the carrier members by a thermal insulator. Although formation of silicon rods having an approximately perfect roundness can be ensured by the above-mentioned method, the unevenness in the diameter of the silicon rods in the longitudinal direction cannot be eliminated.

SUMMARY OF THE INVENTION

Accordingly, an object of the present invention is to provide a method of manufacturing high-purity silicon rods having a uniform sectional shape or a uniform diameter.

Another object of the present invention is to provide a method of manufacturing large-diameter, high-purity silicon rods of excellent quality at a high yield by subjecting monosilane to pyrolysis.

In accordance with the present invention, there is provided a method of manufacturing high-purity silicon rods having a uniform-sectional shape by pyrolyzing a silicon compound on a plurality of rod shaped high-purity silicon carrier members which have been red-heated by directly passing an electric current therethrough, comprising the step of supplying monosilane into a pyrolysis container through multi-stage monosilane supply ports formed in parallel with the axes of said silicon carrier members held vertically within the pyrolysis container while insulating the radiant heat between said red-heated carrier members by a thermal insulator along the overall length thereof, wherein the amount of monosilane supplied through the upper supply ports is increased as compared with that supplied through the lower supply ports in response to the increase of the diameter of each of said silicon rods to be grown up.

The characteristic feature of the present invention resides in that monosilane supply ports are installed vertically in several stages; that the amount of supply of monosilane gas can be adjusted by a flow regulator installed at each stage; that the monosilane gas is then distributed in equal amounts by a gas flow divider installed at each stage in response to the number of monosilane gas supply ports at each stage; and that, as the pyrolysis thermal decomposition reaction proceeds thereby increasing the diameter of each of the high-purity silicon rods, the amount of supply of monosilane gas through the upper supply ports is increased as compared with that through the lower supply ports so that high-purity silicon rods having a uniform sectional shape or approximately equal diameter along the overall length thereof can be produced.

Further, in accordance with the present invention, there is provided a method of manufacturing high-purity silicon rods wherein not only the ratio of supply amounts of monosilane gas respectively supplied through the upper, intermediate and lower supply ports can be increased in response to the increase of the diameter of each of the silicon rods, but also the surface area of each of the silicon rods to be subjected to pyrolysis can be increased with the increase of the diameter thereof, so that the amount of supply of monosilane gas can be correspondingly increased.

BRIEF DESCRIPTION OF THE DRAWINGS

Other objects, features and advantages of the present invention will be apparent from the following description in conjunction with the accompanying drawings in which.

DETAILED DESCRIPTION OF THE PREFERRED EMBODIMENTS

Figure 1:
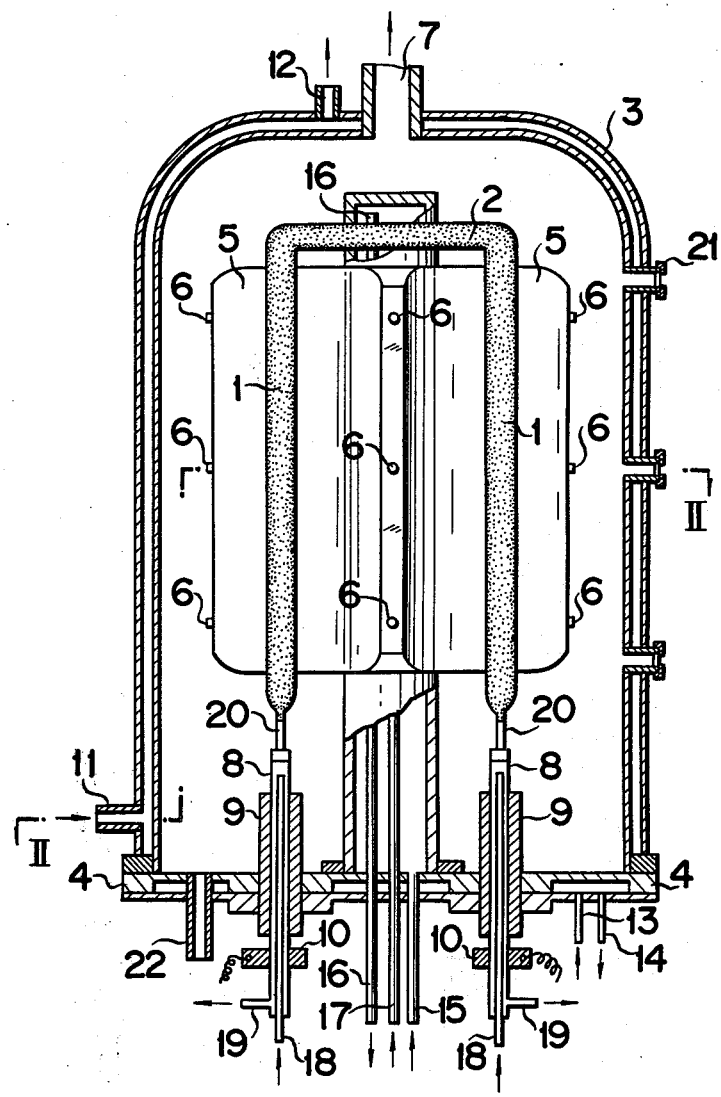
FIG. 1 is a schematic longitudinal sectional view showing one embodiment of the present invention.
Figure 3:
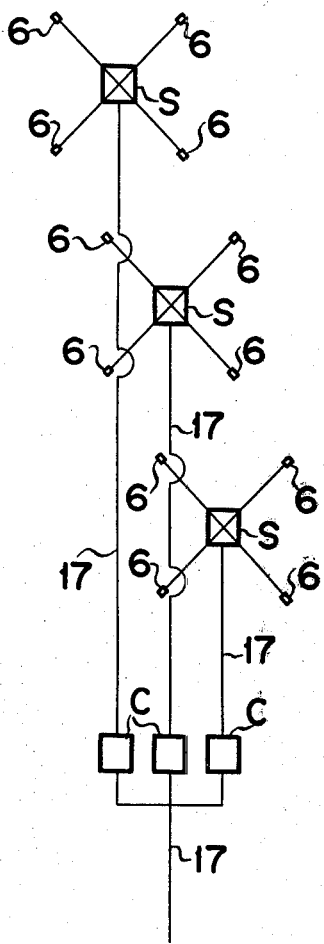
FIG. 3 shows a schematic view of monosilane gas supply piping arrangements according to the present invention.

The present invention will now be hereinafter described in detail by way of an example with reference to the accompanying drawings. As shown in FIG. 1, the pyrolysis device comprises a container 3 and a base member 4. The container 3 has a cavity formed therein and has a coolant inlet pipe 11 which is located at the lower part of the outer face of the container 3 and through which the coolant is introduced therein for cooling the entire container 3. The container 3 has an outlet pipe 12 located in the outer face of the upper part thereof. Provided in the center of the upper part of the container 3 is a discharge port 7 adapted to discharge the thermally decomposed gas. On one side of the container 3 there are provided three windows 21 for observing high-purity silicon rods 1 under pyrolytic condition, said windows being located at three positions corresponding to the upper, intermediate and lower portions of the silicon rods 1. The above-mentioned base member 4 has a cavity formed therein and has a coolant inlet port 13 through which a coolant is introduced so as to cool the base member 4 thereby to protect it from the heat generated by the pyrolysis. Reference numeral 14 denotes a coolant outlet port. Four sets of copper electrodes 8 for heating and holding the vertically extending high-purity silicon rods 1 as carrier members are mounted in the base member 4 through respective thermal insulators 9 in such a manner as to pass through the base member 4 at equal space intervals from one another and from the center thereof. Each of the copper electrodes 8 is connected through a feeder 10 with a heating power source (not shown). Each of the electrodes 8 is protected from the heat generated by the pyrolysis or heat decomposition by introducing coolant through a coolant inlet pipe 18 installed at the lower part of the copper electrode 8. Reference numeral 19 denotes a coolant discharge pipe. Further, the upper part of each copper electrode 8 is adapted to connect with a connecting pole 20 made of tantalum. Connected to each of the tantalum connecting poles 20 is a vertically extending high-purity silicon rod 1, and the upper ends of the adjacent silicon rods 1 are connected to each other by a high-purity silicon rod 2. Mounted in the central part of the above-mentioned base member 4 is a thermal insulator 5 having a radially extending cross-section. Each radially extending part of the insulator 5 is located between the adjacent high-purity silicon rods 1 at equal space intervals from the silicon rods 1. The thermal insulator 5 has a cavity formed therein and also has a coolant inlet pipe 15 passing through the base member 4 and extending vertically along the thermal insulator 5. The thermal insulator 5 is cooled by the coolant which is introduced thereinto through the inlet pipe 15 and is discharged through the coolant discharge pipe 16. Further, inserted in the cavity of the thermal insulator 5 is monosilane supply pipe 17 which passes through the base member 4. The supply pipe 17 is branched off in the cavity of the thermal insulator 5, and is connected to monosilane supply ports 6 formed at the leading ends of insulating plates of the thermal insulator 5. The above-mentioned monosilane supply ports 6 are formed at three stages, namely the upper, intermediate and lower parts of the leading ends of thermal insulating plates of the thermal insulator 5. A hot blast inlet pipe 22 is mounted through the base member 4 to supply the hot blast for preheating use. As shown in FIG. 3, the monosilane supply pipe 17 is branched in three stages or the upper, intermediate and lower stages, each stage having a gas flow regulator "C" installed therein. It is advantageous to employ an automatic gas flow regulator as the gas flow regulator "C". The flow rate of monosilane gas is increased with the increase of the diameter of each of the silicon rods, and the ratio of flow rates in the respective stages can be varied in such a manner that the ratio of the flow rate in the uper stage relative to that in the lower stage can be increased with the increase of the diameter of the silicon rods. The ratio of the flow rates through the monosilane gas supply ports of respective stages can be increased with the increase of the diameter of the silicon rods as mentioned above, and adjustment can be made by the gas flow regulators "C" at each stage so that the flow rate of the gas supplied through the upper stage supply ports becomes always greater than that supplied through the lower stage supply ports. The monosilane gas, the flow rate of which has been regulated by the flow regulator "C" at each stage, is distributed in equal amounts by a gas flow divider "S" and is allowed to flow through the monosilane gas supply ports 6 into the container 3.

Each of the gas flow dividers "S" comprise a capillary tube and a filter to protect the tube, and should desirably be capable of ensuring a uniform distribution of gas with the accuracy of within a few percent.

One example of the method according to the present invention will now be described below.

EXAMPLE

Figure 2:
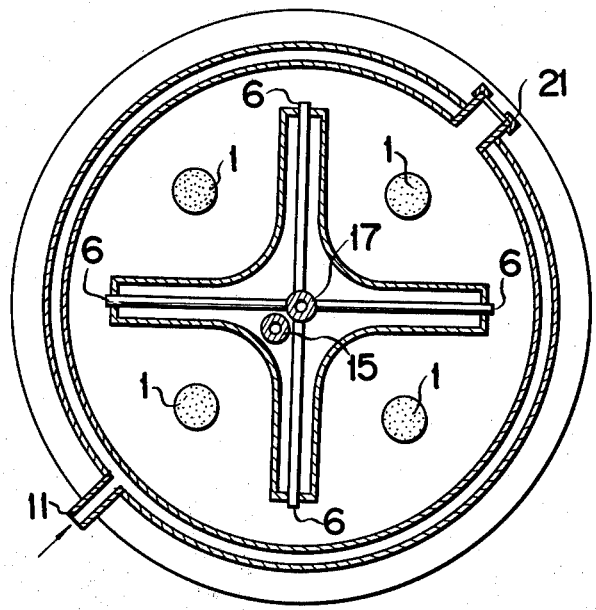
FIG. 2 is a sectional view taken along the line II—II in FIG. 1.

The device as shown in FIGS. 1 and 2 and rod-shaped silicon carrier members each having a diameter of 5 mm and a length of 1,200 mm were employed to conduct a thermal decomposition of a high-purity refined monosilane by the adsorption refining process. The silicon carrier members were kept at temperatures from 800° C. to 900° C. and the flow rate of the monosilane gas was set such that the growth rate of silicon of 4 $\mu$m to 8 $\mu$m could be obtained. The result obtained thereby is shown in the following Table 1.

Table I

| | Diameter of Product (mm) | Ratio of Flow Rates | | | Ratio of Diameter of Product (Results) | | |
|---|---|---|---|---|---|---|---|
| | | upper | intermediate | lower | upper | intermediate | lower |
| (1) | 50 | 1 | 0 | 0 | 1.10 | 1.05 | 1.00 |
| (2) | 50 | 0 | 0 | 1 | 1.00 | 1.20 | 1.30 |
| (3) | 100 | 1 | 0 | 0 | 1.30 | 1.10 | 1.00 |
| (4) | 50 | 1 | 1 | 1 | 1.00 | 1.03 | 1.07 |
| (5) | 100 | 1 | 1 | 1 | 1.00 | 1.08 | 1.20 |

Table I-continued

| | Diameter of Product (mm) | Ratio of Flow Rates | | | Ratio of Diameter of Product (Results) | | |
|---|---|---|---|---|---|---|---|
| | | upper | intermediate | lower | upper | intermediate | lower |
| (6) | 30 | 1.03 | 1 | 0.97 | 1.00 | 1.00 | 1.00 |
| (7) | 50 | 1.1 | 1 | 0.9 | 1.02 | 1.00 | 1.01 |
| (8) | 70 | 1.2 | 1 | 0.8 | 1.02 | 1.00 | 1.02 |
| (9) | 100 | 1.4 | 1 | 0.6 | 1.03 | 1.00 | 1.02 |

The figures in items (1) to (3) of Table 1 show the result obtained by the conventional process, those in items (4) and (5) show the result obtained by the method without the above-mentioned improvement wherein the monosilane gas supply ratio is not controlled; and those in items (6) to (9) show the result obtained by the method of the present invention. The ratio of diameters of products employed herein is meant by a value obtained by dividing the representative or mean value of diameters of the upper, intermediate and lower portions of the obtained silicon rods by the minimum diameter thereof. The figures of flow ratios given in Table 1 show those corresponding to various diameters of the products then obtained. Starting values at the upper, intermediate and lower stages were set at 1:1:1 in the diameter near the silicon carrier members, and the ratio of flow rates was changed gradually up to the value given in Table 1 with the increase of the diameter of each silicon rod. According to this example, a silicon rods having a remarkably improved roundness could be obtained, and as is apparent from Table 1, the ratios of diameters of products given in items (6) to (9) were smaller than any of the values given in items (1) to (5). Further, no mixture of amorphous silicon produced by homogeneous reaction in gaseous phase inherent in monosilane with the silicon rod product was observed.

As mentioned hereinabove, according to the method of the present invention, high-purity silicon rods each having a high quality and a uniform sectional shape can be readily obtained. Accordingly, the thus obtained slicon rods can be used as the raw material for the float zone melting process without molding or reforming it, and therefore the productivity thereof can be improved by several-ten percents from that of the conventional method.

It is to be understood that the foregoing description is merely illustrative of the preferred embodiment of the invention and that the scope of the invention is not to be limited thereto, but is to be determined by the scope of the appended claims.

What is claimed is:

1. A method of manufacturing high-purity silicon rods having a uniform sectional shape by subjecting a silicon compound to pyrolysis on a plurality of rod-shaped high-purity silicon carrier members which have been red-heated by directly passing an electric current therethrough thereby depositing high-purity silicon thereon, comprising the step of supplying monosilane into a pyrolysis container through multi-stage, upper and lower monosilane supply ports located in parallel with the axes of said silicon carrier members held vertically within the pyrolysis container while insulating the radiant heat between said red-heated carrier members by a thermal insulator along the overall length thereof, wherein the amount of supply of monosilane through the upper supply ports is increased as compared with that through the lower supply ports in response to the increase of the diameter of each of said silicon rods.

2. The method as claimed in claim 1, wherein said multi-stage monosilane supply ports consist of three stages ports, namely the upper, intermediate and lower stage ports.

3. The method as claimed in claim 1, wherein monosilane is supplied through the leading ends of thermal insulating plates of the thermal insulator located in parallel with the axes of said silicon carrier members.

4. The method as claimed in claim 1, wherein the amount of supply of monosilane gas is increased with the increase of the diameter of each of said high-purity silicon rods.

* * * * *